(12) United States Patent
Hua et al.

(10) Patent No.: US 10,777,538 B2
(45) Date of Patent: *Sep. 15, 2020

(54) SYSTEM ON PACKAGE ARCHITECTURE INCLUDING STRUCTURES ON DIE BACK SIDE

(71) Applicant: INTEL CORPORATION, Santa Clara, CA (US)

(72) Inventors: Fay Hua, Fremont, CA (US); Telesphor Kamgaing, Chandler, AZ (US); Johanna M. Swan, Scottsdale, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/399,726

(22) Filed: Apr. 30, 2019

(65) Prior Publication Data

US 2019/0326258 A1 Oct. 24, 2019

Related U.S. Application Data

(63) Continuation of application No. 15/476,872, filed on Mar. 31, 2017, now Pat. No. 10,304,804.

(51) Int. Cl.
*H01L 25/065* (2006.01)
*H01L 23/48* (2006.01)
(Continued)

(52) U.S. Cl.
CPC ........ *H01L 25/0657* (2013.01); *H01L 21/022* (2013.01); *H01L 21/76874* (2013.01); *H01L 21/76885* (2013.01); *H01L 23/293* (2013.01); *H01L 23/3192* (2013.01); *H01L 23/481* (2013.01); *H01L 23/64* (2013.01); *H01L 24/05* (2013.01); *H01L 24/06* (2013.01); *H01L 24/16* (2013.01); *H01L 25/50* (2013.01); *H01L 23/3128* (2013.01); *H01L 23/5223* (2013.01); *H01L 23/5227* (2013.01);
(Continued)

(58) Field of Classification Search
CPC .................................................. H01L 25/0657
See application file for complete search history.

(56) References Cited

U.S. PATENT DOCUMENTS 9,824,962 B1 11/2017 Hua et al.
10,304,686 B2 5/2019 Oster et al.
(Continued)

OTHER PUBLICATIONS

U.S. Appl. No. 15/279,708, filed Sep. 29, 2016, Invented by Hua et al., issued as U.S. Pat. No. 9,824,962.
(Continued)

*Primary Examiner* — William Coleman
(74) *Attorney, Agent, or Firm* — Konrad Raynes Davda & Victor LLP; Alan S. Raynes

(57) ABSTRACT

Embodiments include devices and methods, including a device including a substrate comprising a semiconductor, the substrate including a front side comprising active elements and a backside opposite the front side. The device includes a dielectric layer on the backside, and a passive component on the dielectric layer on the backside. In certain embodiments, the passive device is formed on a self-assembled monolayer (SAM). Other embodiments are described and claimed.

20 Claims, 7 Drawing Sheets

(51) Int. Cl.

| | |
|---|---|
| *H01L 23/00* | (2006.01) |
| *H01L 23/31* | (2006.01) |
| *H01L 25/00* | (2006.01) |
| *H01L 21/02* | (2006.01) |
| *H01L 23/29* | (2006.01) |
| *H01L 23/64* | (2006.01) |
| *H01L 21/768* | (2006.01) |
| *H01L 23/66* | (2006.01) |
| *H01L 23/522* | (2006.01) |

(52) U.S. Cl.
CPC .............. *H01L 23/66* (2013.01); *H01L 24/03* (2013.01); *H01L 24/13* (2013.01); *H01L 24/17* (2013.01); *H01L 2223/6677* (2013.01); *H01L 2224/024* (2013.01); *H01L 2224/0239* (2013.01); *H01L 2224/02311* (2013.01); *H01L 2224/02313* (2013.01); *H01L 2224/02315* (2013.01); *H01L 2224/02372* (2013.01); *H01L 2224/0401* (2013.01); *H01L 2224/05008* (2013.01); *H01L 2224/05147* (2013.01); *H01L 2224/05164* (2013.01); *H01L 2224/05541* (2013.01); *H01L 2224/06181* (2013.01); *H01L 2224/131* (2013.01); *H01L 2224/16113* (2013.01); *H01L 2224/16146* (2013.01); *H01L 2224/16148* (2013.01); *H01L 2224/16225* (2013.01); *H01L 2224/17181* (2013.01); *H01L 2224/73204* (2013.01); *H01L 2225/06513* (2013.01); *H01L 2225/06517* (2013.01); *H01L 2225/06541* (2013.01); *H01L 2924/01029* (2013.01); *H01L 2924/1903* (2013.01); *H01L 2924/19041* (2013.01); *H01L 2924/19042* (2013.01)

(56) References Cited

U.S. PATENT DOCUMENTS

| | | | |
|---|---|---|---|
| 10,304,804 B2 * | 5/2019 | Hua | ........................ H01L 24/06 |
| 2009/0239331 A1 | 9/2009 | Xu et al. | |
| 2010/0065942 A1 | 3/2010 | Lin et al. | |
| 2011/0194260 A1 | 8/2011 | Jung et al. | |
| 2013/0105967 A1 | 5/2013 | Lee et al. | |
| 2015/0255372 A1 | 9/2015 | Kamgaing | |
| 2017/0092620 A1 | 3/2017 | Haba et al. | |
| 2017/0154790 A1 | 6/2017 | Hua et al. | |
| 2018/0096975 A1 | 4/2018 | Hua et al. | |
| 2018/0098428 A1 | 4/2018 | Hua et al. | |
| 2018/0286687 A1 | 10/2018 | Oster et al. | |
| 2018/0286834 A1 | 10/2018 | Hua et al. | |

OTHER PUBLICATIONS

U.S. Appl. No. 15/282,473, filed Sep. 30, 2016, Invented by Hua et al., published as US 20180096975.
Pending U.S. Appl. No. 15/283,352, filed Oct. 1, 2016, Invented by Hua et al., published as US 20180098428.
U.S. Appl. No. 15/476,842, filed Mar. 31, 2017, Invented by Oster et al., issued as U.S. Pat. No. 10,304,686.
"Molecular Self-Assembly", Material Matters, Sigma-Aldrich, vol. 1, No. 2 (2006), pp. 1-5.
Wikipedia, "Self-assembled monolayer", [online] Last Modified on Jun. 30, 2016, [Retrieved on Nov. 29, 2016], Retrieved from the Internet at <URL: http://en.wikipedia.org/wiki/Self-assembled_monolayer, 12 pp.
Office Action 1 for U.S. Appl. No. 15/476,842, dated Sep. 14, 2018, 25 pp. [77.380 (OA1)].
Response to Office Action 1 for U.S. Appl. No. 15/476,842, dated Dec. 14, 2018, 9 pp. [77.380 (ROA1)].
Notice of Allowance 1 for U.S. Appl. No. 15/476,842, dated Jan. 15, 2019, 7 pp. [77.380 (NOA1)].
Office Action 1 for U.S. Appl. No. 15/476,872, dated Nov. 20, 2017, 22 pp. [77.381 (OA1)].
Response to Office Action 1 for U.S. Appl. No. 15/476,872, dated Feb. 20, 2018, 10 pp. [77.381 (ROA1)].
Final Office Action 1 for U.S. Appl. No. 15/476,872, dated May 2, 2018, 15 pp. [77.381 (FOA1)].
Response to Final Office Action 1 for U.S. Appl. No. 15/476,872, dated Jul. 2, 2018, 9 pp. [77.381 (RFOA1)].
Notice of Allowance 1 for U.S. Appl. No. 15/476,872, dated Sep. 25, 2018, 8 pp. [77.381 (NOA1)].
Notice of Allowance 2 for U.S. Appl. No. 15/476,872, dated Jan. 30, 2018, 13 pp. [77.381 (NOA2)].
U.S. Appl. No. 16/399,703, filed Apr. 30, 2019, Invented by Oster et al., 37 pp. [77.380C1 (Appln)].
Preliminary Amendment for U.S. Appl. No. 16/399,703, filed Apr. 30, 2019, 7 pp. [77.380C1 (PrelimAmend)].
Notice of Allowance for U.S. Appl. No. 16/399,703, dated Mar. 24, 2020, 13 pp. [77.380C1 (NOA1)].

* cited by examiner

SYSTEM ON PACKAGE ARCHITECTURE INCLUDING STRUCTURES ON DIE BACK SIDE

TECHNICAL FIELD

Embodiments described herein relate to devices and processes to form devices including a system on package architecture including forming structures on the back side thereof.

BACKGROUND

Electronic assemblies may include stacked die assemblies including a first die having a second die stacked thereon. The bottom die may include through-substrate vias (TSVs) extending through the thickness of the die, from the front (active) side to the back side of the die. The second die may be stacked on the back side of the die, and signals may travel between the first die and the second die through the TSV's. Lithographic methods including the use of a spin-on dielectric have been used to form the TSV's and to form the electrical connections on the back side of the die that are electrically coupled to the stacked die.

BRIEF DESCRIPTION OF THE DRAWINGS

Embodiments are described by way of example, with reference to the accompanying drawings, in which like reference numerals may refer to similar elements.

DESCRIPTION OF EMBODIMENTS

References in the specification to "embodiments," "certain embodiments," "an embodiment," etc., indicate that the embodiment described may include a particular feature, structure, or characteristic, but every embodiment may not necessarily include the particular feature, structure, or characteristic. Moreover, such phrases are not necessarily referring to the same embodiment. Certain embodiments relate to the formation of devices including a substrate such as a semiconductor die that includes structures including, but not limited to, passive devices, formed on a back side thereof.

Certain embodiments relate to architectures for SOP (system on package) and stacking die structures, including laminating a dielectric layer on the back side of a die, using a process such as self-assembled monolayer (SAM) assisted structuring process for forming structures including, but not limited to, passives for RF and analog applications, and fan out a redistribution layer (RDL) on the back side circuitry. The die may include TSVs extending therethrough. Conventional processes utilize lithography for forming the TSVs as well as the RDL on the backside of the die. In addition, most of the area on the backside is neither well utilized nor optimized for use in RF and analog circuits. Embodiments include architectures and processes for forming structures that optimize the use of the die backside.

Figure 1A:
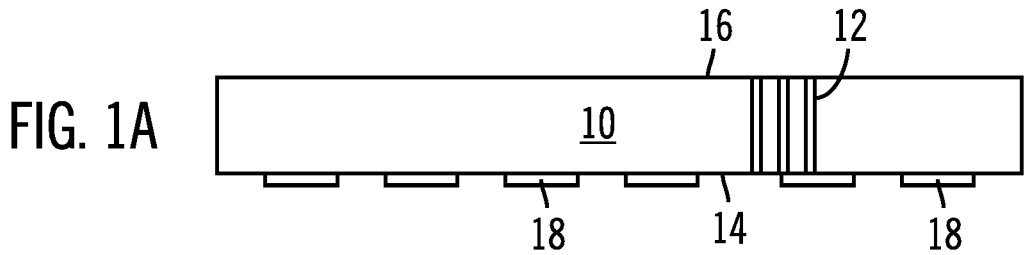
FIGS. 1A-1G illustrate the formation of an assembly in accordance with certain embodiments.

FIG. 1A illustrates a process flow in accordance with certain embodiments. The structure includes a substrate such as a die 10 including a plurality of TSVs 12 extending from a front side 14 to a backside 16 and includes a plurality of bonding pads 18 on the front side 14. The substrate may comprise a material including, but not limited to, silicon, gallium arsenide, gallium nitrite, and glass.

Figure 1B:
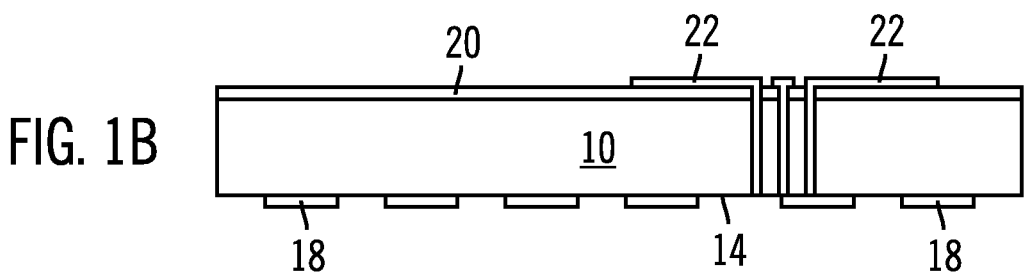

FIG. 1B illustrates the formation of a redistribution layer (RDL) to distribute the electrically conductive pathways through the TSVs 12 to desired positions on the backside 16. The RDL may include conductive regions 22 formed on dielectric layer 20. Depending on the desired RDL scheme, multiple dielectric and electrically conductive layers may be used. The layers of dielectric material 20 and electrically conductive material 22 may be formed using any suitable processes including, for example, CVD chemical vapor deposition (CVD) of a 1-2 μm oxide layer for the dielectric, and plating a Cu layer for the electrically conductive material.

Figure 1C:
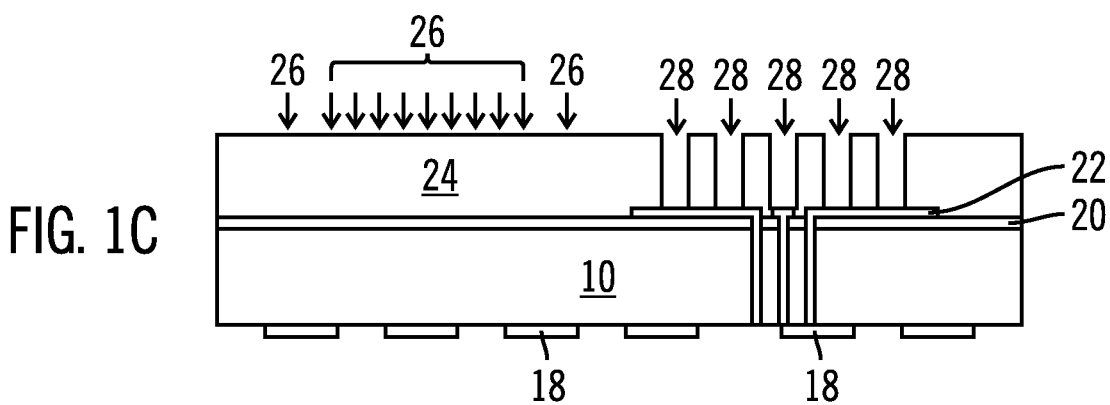

FIG. 1C illustrates forming a dielectric layer 24 on the RDL on the backside, and performing laser patterning for formation of a self-assembled monolayer (SAM) in regions 26, and for forming openings 28 in the dielectric layer 24 for connection to the RDL conductive regions 22. The dielectric layer 24 may be formed from a material including, but not limited to, a polymer such as an epoxy or other resin, for example, a laminateable build-up film or a liquid crystal polymer. In certain embodiments, the dielectric layer 24 comprises a laminate dielectric layer. A laminate dielectric layer includes a dielectric film that is prefabricated and may be attached to a surface by using an adhesive (e.g. glue) or heating and pressing onto a surface. Chemical adhesive promoters may also be used to attach the dielectric film to another surface. The use of a laminate dielectric layer enables the formation of a relatively uniform thickness dielectric layer. Certain embodiments utilize a laminate dielectric layer having a thickness of about 2 microns to about 100 microns. In certain embodiments, multiple film layers may be used to make up a laminate dielectric layer. Other types of dielectric layers may have problems due to high cost (CVD) and/or inability to form a layer of acceptable thickness uniformity across its area.

Figure 1D:
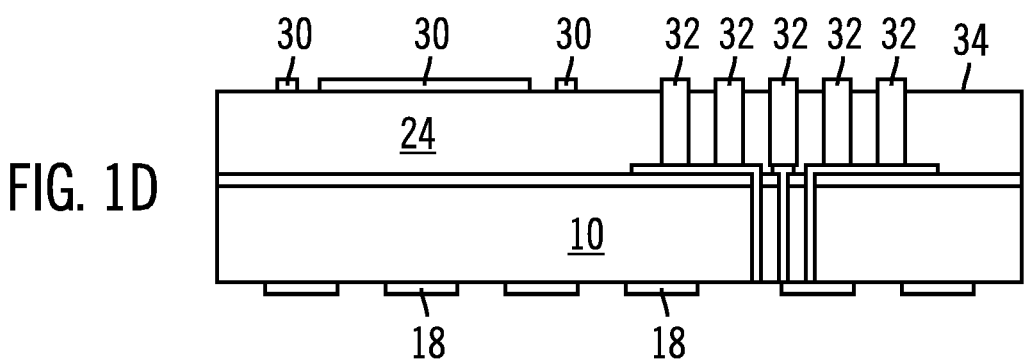
Figure 1E:
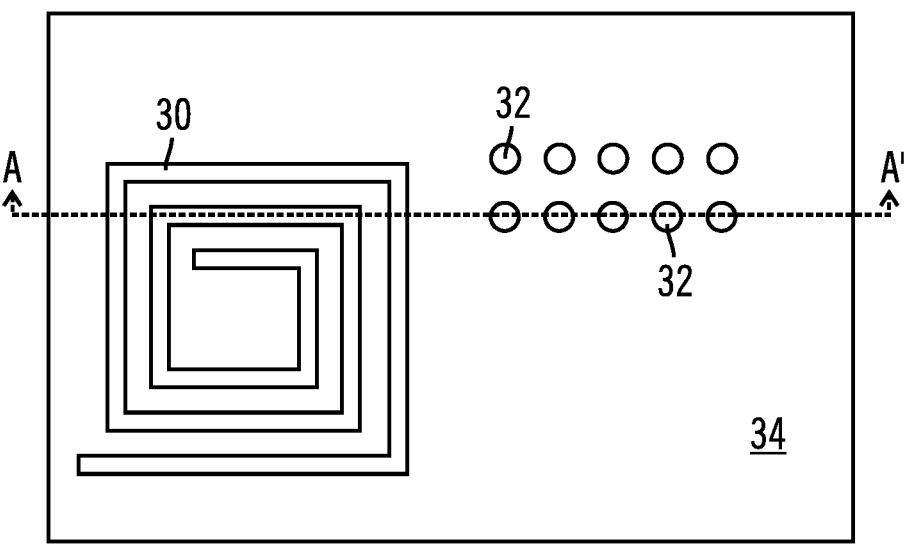

FIG. 1D illustrates the formation of electrically conductive regions 30 on the SAM in regions 26, and electrically conductive regions 32 in the openings 28. These electrically conductive regions may be formed using a plating process such as electroless metal deposition. Various types of structures, including, but not limited to, passive structures for RF and analog operations, may be formed on the backside of the die. FIG. 1E illustrates a top down view of the upper surface 34 illustrated in FIG. 1D, with FIG. 1D illustrating a cross-sectional view along the line A-A' in FIG. 1E. FIG. 1E shows the electrically conductive regions 30 on the SAM region, and the electrically conductive regions 32 in the openings 28. The electrically conductive regions 30 may comprise an inductor. Positioning an inductor on the dielectric layer 24 on the backside of the substrate may have a higher Q (quality factor) than if positioned on a dielectric layer on the front (active) side of the substrate, due to the increased distance from the lossy silicon substrate surface. The electrically conductive regions 32 may extend through the openings 28 and include pads on which another die or component may be coupled, as described below in connection with FIG. 1G.

Figure 1F:
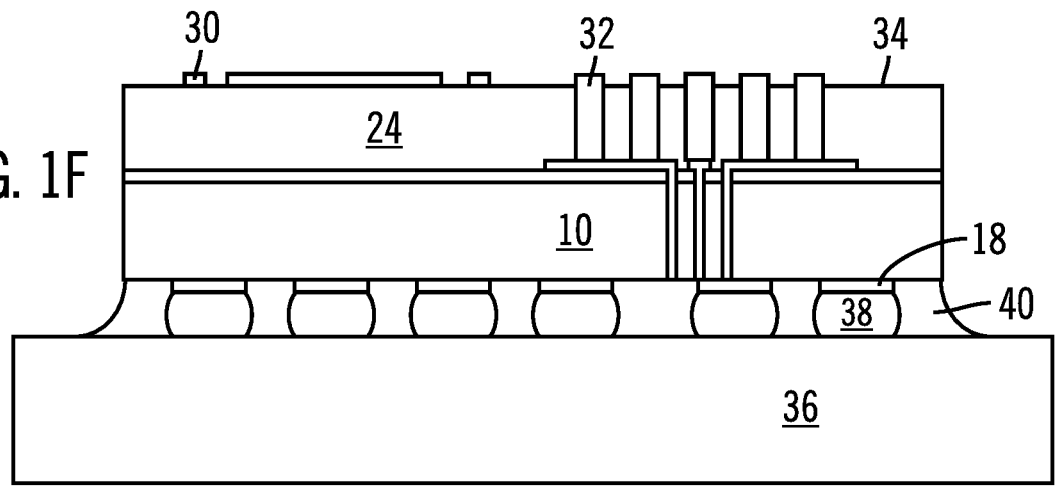
Figure 1G:
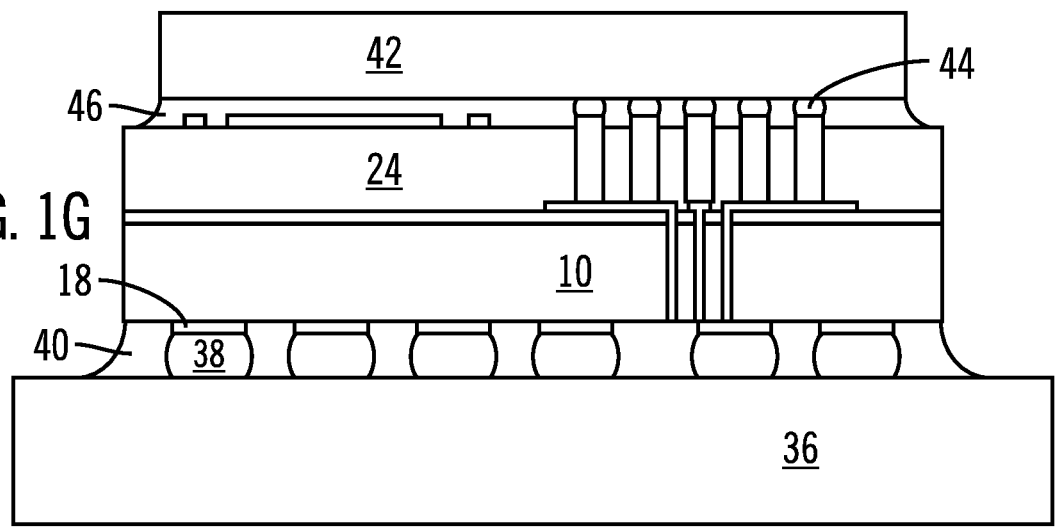

FIG. 1F illustrates coupling the die 10 to a package substrate 36 through solder bumps 38 that are positioned on the pads 18 on the die 10. A protective underfill layer 40 may be positioned between the die and the package substrate 36. FIG. 1G illustrates coupling another die 42 to the assembly through solder connections 44 that are positioned on the electrically conductive regions 32 that act as bonding pads on the backside of the substrate 10. A protective underfill layer 44 may be positioned between the additional die 42 and dielectric layer 24 on the backside of the substrate 10. By positioning structures such as passives close to the stacked die on the backside of the substrate, parasitics are reduced compared to positioning the passives on the front (active) side of the substrate. While FIGS. 1A-1F show one layer of dielectric it is understood that multiple dielectric layers with multiple layers of conductive features may be formed.

An example of a SAM assisted structuring process for forming the electrically conductive regions 30 is discussed below.

Using a self-assembled monolayer (SAM) assisted structuring process, a metal structure may be formed on a dielectric material (such as a polymer) by bonding a conductive material to the dielectric material through a self-assembled monolayer (SAM). A SAM assisted structuring process may include activating an area of a dielectric material such as a polymer with electromagnetic radiation, then modifying the active area, then forming a SAM on the modified activated area, then reacting the SAM with a catalyst, then reacting the SAM that was reacted with a catalyst with a conductive material. In one embodiment, an area of a polymer layer on a substrate is activated using, for example, electromagnetic radiation. The operations may also include modifying the activated area, forming a self-assembled monolayer on the modified active layer, reacting the self-assembled monolayer with a catalyst, and reacting the catalyzed self-assembled monolayer with a metal. The resultant metal structure formed may be chemically bonded to the self-assembled monolayer through the catalyst, and thus bonded to the underlying dielectric material.

Figure 2:
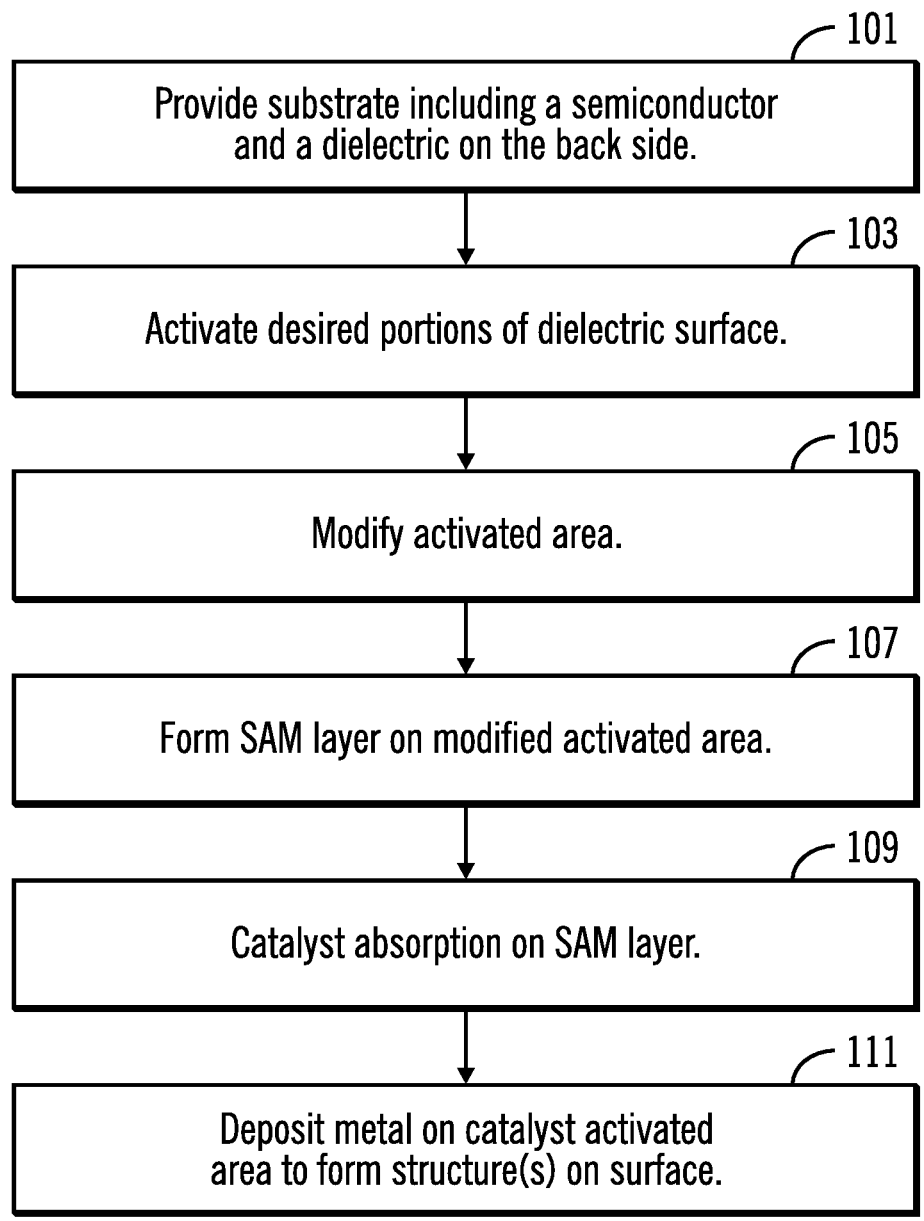
FIG. 2 illustrates a flowchart of operations, in accordance with certain embodiments.

FIG. 2 illustrates a flowchart of a method for forming structures on a substrate such as illustrated in FIGS. 1C-1D, using a self-assembled monolayer (SAM) assisted structuring process, in accordance with certain embodiments. Box 101 is providing a substrate including a semiconductor and a dielectric surface region on which it is desired to form metallized structures. The dielectric surface region may be formed from a material including, but not limited to, a laminate dielectric polymer such as an epoxy or other resin.

Box 103 includes activating the desired area by exposure, for example, to electromagnetic radiation such as ultraviolet (UV) laser radiation. FIG. 1C illustrates activated regions 26 on the dielectric layer 24. It is believed that the activation serves to break or otherwise disassociate bonds in the polymer layer. In certain embodiments, activation may be carried out as follows. First, the substrate is positioned on a stage. A pulsed-wave ultraviolet (UV) laser is connected to a servomechanism that controls a mechanical position in at least an XZ direction of the laser. The laser may direct electromagnetic radiation in the form of a beam to a galvanometer that steers the beam towards the substrate on the stage. In one embodiment, the laser may have a wavelength of 355 nanometers and a power of 0.904 watts at 29 amps. A width of the beam may in certain embodiments be similar to a width of a desired line of trace to be patterned on a polymer region on the substrate. A mirror may be disposed between the galvanometer and stage to collimate the radiation. The system may be computer controlled, and may include a Drawing eXchange Format (DXF) file or the like, of a pattern for a specific substrate for locating the regions to be treated.

Figure 3:
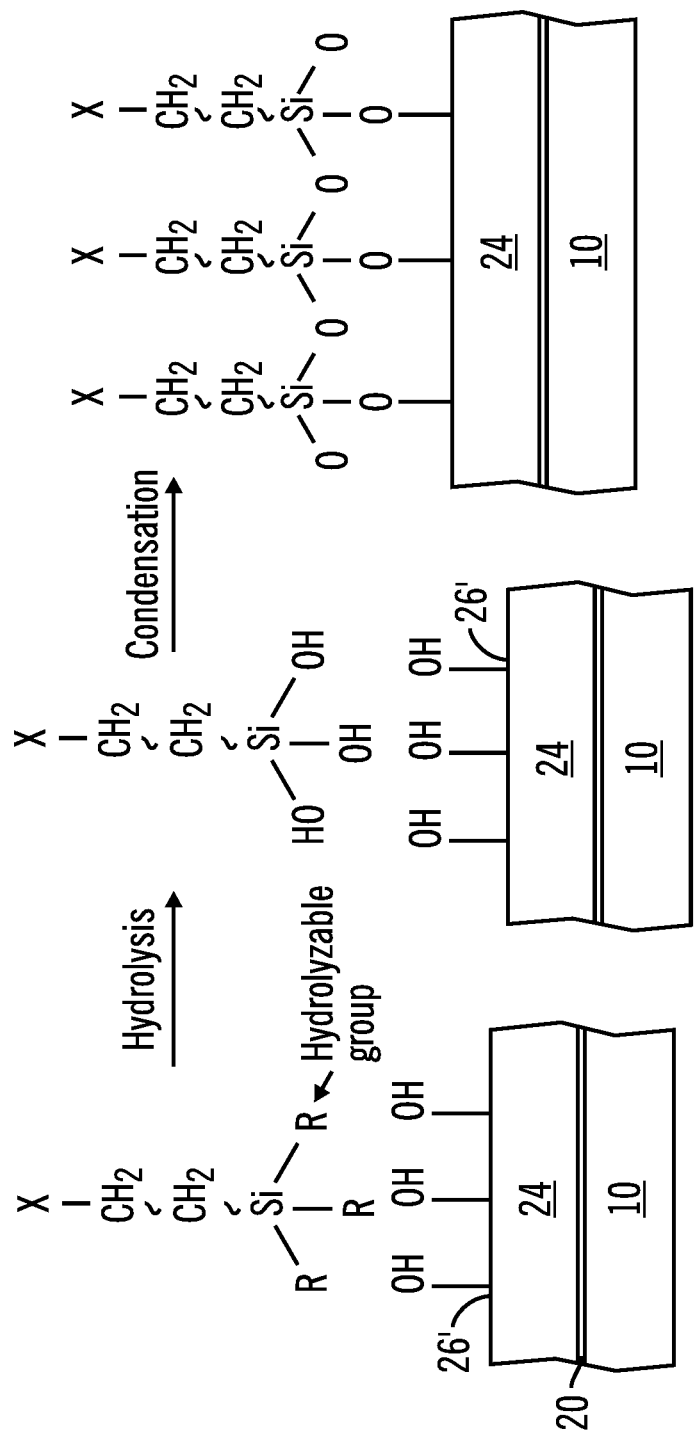
FIG. 3 illustrates certain operations is the formation of a self-assembled monolayer on a substrate, in accordance with certain embodiments.

Box 105 of FIG. 2 is modifying the activated area. This may, in certain embodiments, be carried out by performing hydrolysis to form OH (hydroxyl) rich areas on the activated portion of the substrate. FIG. 3 illustrates views of a portion of the device illustrated in FIG. 1C during the SAM formation operations, including the substrate 10 having the dielectric layer 24 with the laser activation area 26 (and dielectric layer 20 deposited during RDL formation as described above and illustrated in FIG. 1B). The hydrolysis may be carried out by exposing the activated area 26 to water such as by placing the device or a portion thereof into a tank of water to allow hydroxyl moieties to react or otherwise bond with the activated area, for example, in a hydrolysis process that forms a hydroxyl-rich area 26' as seen in FIG. 3.

Box 107 of FIG. 2 is forming a self-assembled monolayer (SAM) on the modified activated area. Certain embodiments are formed from an organosilicon compound such as a siloxane (for ex., $R_3Si—O—SiR_3$) or silanol (for ex., $R_3SiOH$). In one embodiment, an organosilicon (siloxane) compound is dissolved in a solvent such as toluene, dimethylformanide (DMF), or hexane and is introduced to the modified (hydrolyzed) activated area 26' on the dielectric layer 24 on the substrate 10, as seen in the left side of FIG. 3. The siloxane undergoes hydrolysis to form a plurality of OH (hydroxyl) groups, as seen in the central portion of FIG. 3, followed by a condensation with hydroxyl moieties on the modified activated area 26' the substrate 210 to form the self-assembled monolayer (SAM), as seen in the right side of FIG. 3. The organosilicon compound may include a functional group, X, that is suitable for reaction with a catalyst. Representative functional groups may include, but are not limited to, an amine moiety, a sulfhydryl moiety and a pyridil moiety, for reacting with, for example, a palladium (Pd) catalyst.

Figure 4:
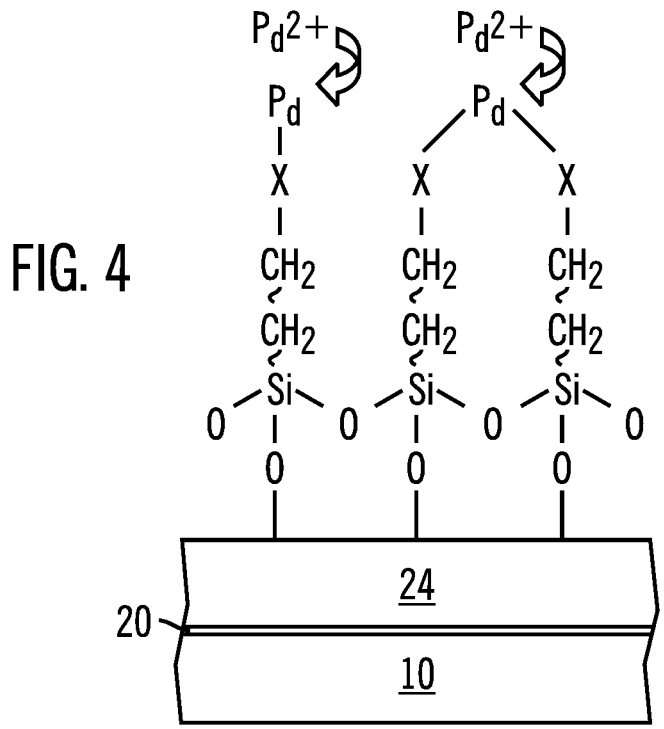
FIG. 4 illustrates a catalyst being coupled to the self-assembled monolayer of FIG. 3, in accordance with certain embodiments.

Box 109 of FIG. 2 is absorbing a catalyst on the SAM layer. This may be carried out by reacting the SAM layer with a catalyst such as a palladium (Pd) material. As noted above, when the SAM includes a suitable reactive functional group (for ex., an amine moiety, a sulfhydryl moiety, a pyridil moiety), the SAM may react with a catalyst. A reaction of palladium ions with the functional groups X of the SAM attached to the dielectric layer 24 on the substrate 10, in accordance with certain embodiments, is illustrated in FIG. 4. The palladium is in an oxidized state ($Pd^{2+}$) in solution (e.g., $PdCl_2$). The palladium ions may attach to the functional groups X of the self-assembled monolayer. As a result, the palladium catalyst reaction (e.g., absorption) will be carried out on the SAM on the dielectric layer 24 on the substrate 10.

Figure 5:
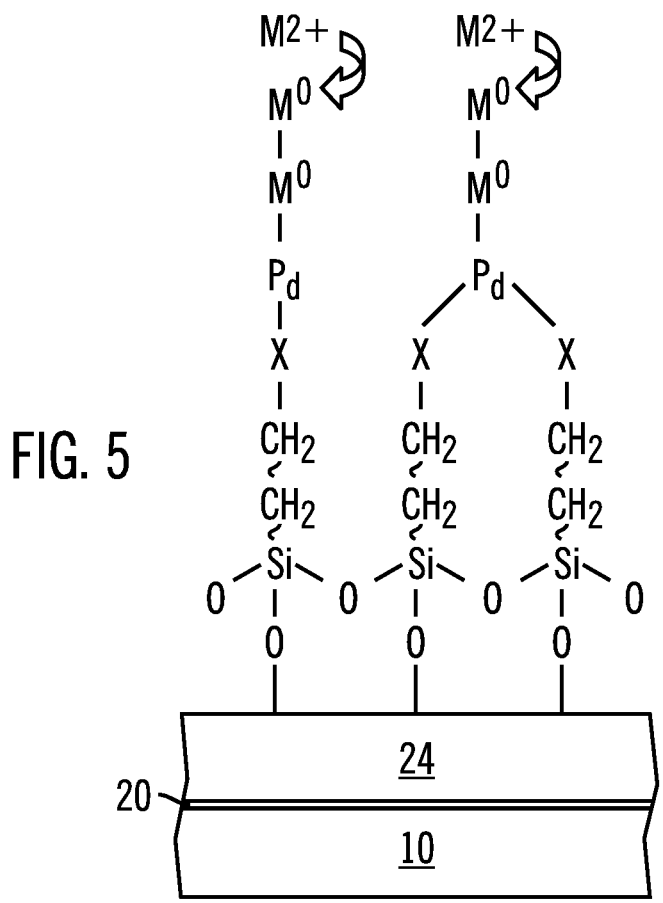
FIG. 5 illustrates a metal being coupled to the self-assembled monolayer of FIG. 4, in accordance with certain embodiments.

Box 111 of FIG. 2 is depositing metal on the catalyst activated area to form the desired structure, such as the structure 30 in FIG. 1E. A reaction of a metal with the palladium catalyst on the SAM, in accordance with certain embodiments, is illustrated in FIG. 5, with the palladium (Pd) positioned between the metal($M°$) and the functional group (X) of the SAM. The surface including the SAM may be placed in a bath with an ionic form of the metal (for ex., nickel ion, copper ion, etc.) and a reducing agent such as, for example, an amine, a borane or a hypophosphite. An electroless oxidation-reduction (redox) reaction occurs between the reducing agent in the bath and an electrolyte. The reducing agent is oxidized and palladium on the SAM is reduced. The reduced palladium acts as a catalyst for a reduction of the metal ions in the bath to metallic to form first nuclei and then form a metal film, resulting in metallization that forms structures including, but not limited to, passive devices such as inductors, capacitors, filters, signal lines, stubs, and pads, of a predetermined shape and size. In the embodiment illustrated in FIGS. 1D-1F, the SAM is used to form structure 30 that comprises an inductor.

In addition, the laser used for forming the activated area 26 for forming the SAM may also be used to form the openings 28 in the dielectric layer 24. The laser treatment to form the openings 28 may differ in certain respects (duration of treatment, etc.) from that used to form the activated area 26 In certain embodiments, the aspect ratio of the openings 28 and dielectric layer thickness should be about 1:1 when using a laminate dielectric with laser drilling. The ratio may in certain embodiments become smaller if photodefinable dielectric material is used because that enables the creation of lithographically defined openings. In certain embodiments, the openings 28 may range from a few microns to tens of microns.

Certain embodiments permit the formation of electrically conductive structures that may be formed in electrical contact with other features, by electroless deposition through the use of self-assembled monolayers (SAMs) grafted on activated substrates. The activated area may be defined by the area of laser treatment on the substrate. The SAMs are able to bind catalyst ions that act as nucleation points for a metal electroless reaction and metal deposition. Exposing the nucleation points on the SAMs to an electroless bath allows desired metal ions to be reduced to form the desired metal structure. A thickness of the metal may be controlled based on the exposure to the bath. Structures of virtually any size or shape may be formed.

Embodiments may also include the formation of multi-layer structures using a SAM assisted construction method such as described above. This may be carried out by depositing another dielectric layer over the metal layer formed, then the layer as described above to form another metal layer thereon, for forming a structure including, but not limited to, a multilayer component including a capacitor such as a MIM (metal insulator metal), and a filter (or filter component) or other structure requiring a ground plane. Multilayer structures may include some layer(s) on which a SAM is formed and other layer(s) on which no SAM is formed.

Figure 6A:
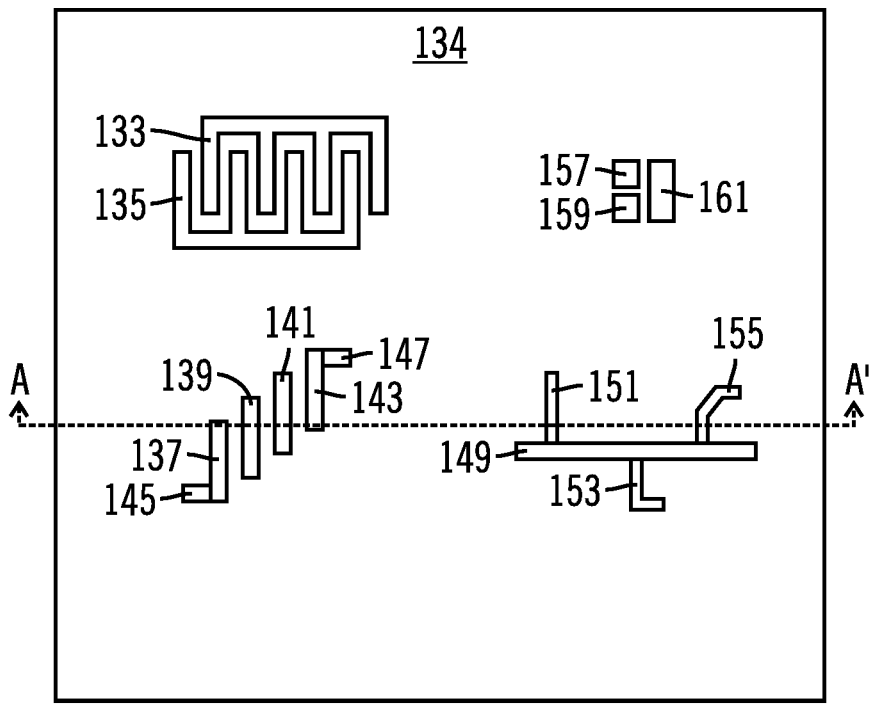
FIGS. 6A-6B illustrate a substrate including a plurality of structures formed thereon, in accordance with certain embodiments.

FIG. 6A illustrates a top down view of a surface 134 of a dielectric layer on the backside of a substrate, including a plurality of structures that may be at least partly formed using the SAM formation and metal deposition operations described above. Each of the structures illustrated may be coupled to other structures (not shown) on the surface 134 or at another layer of the device. The illustrated structures include: (i) a capacitor having electrodes 133 and 135; (ii) a distributed filter including traces 137, 139, 141, and 143, with signal-in section 145 coupled to trace 137 and signal-out section 147 coupled to trace 143; (iii) a signal trace 149 including stubs 151, 153, and 155 extending therefrom; and (iv) pads 157, 159, and 161 for coupling another component (including, but not limited to, a die, memory, sensor, antenna, high speed transceiver and other RF (radio frequency) and non-RF elements) thereto. The number, size, and layout of pads may vary depending on factors such as the footprint of the component to be coupled to the pads. A protective dielectric layer or solder mask may be positioned on the structures if desired.

Figure 6B:
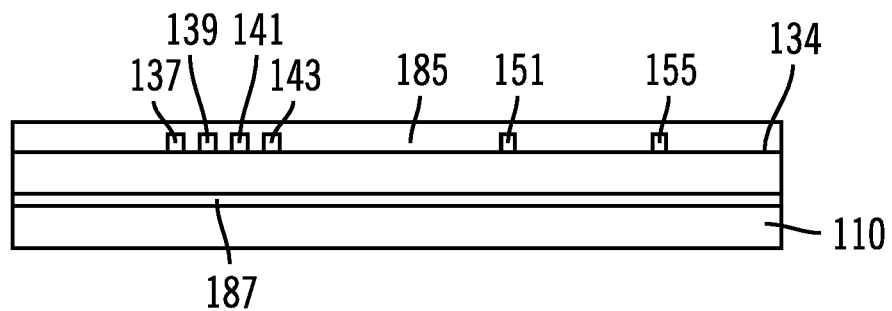

FIG. 6B illustrates a cross-sectional view along the line A-A' in FIG. 6A, and includes the filter including traces 137, 139, 141, 143, as well as the stubs 151, 155, positioned on the surface 134. A protective layer 185 is illustrated on the traces 137, 139, 141, 143, and on the stubs 151, 155. The substrate 110 may include an embedded ground plane 787.

Figure 7:
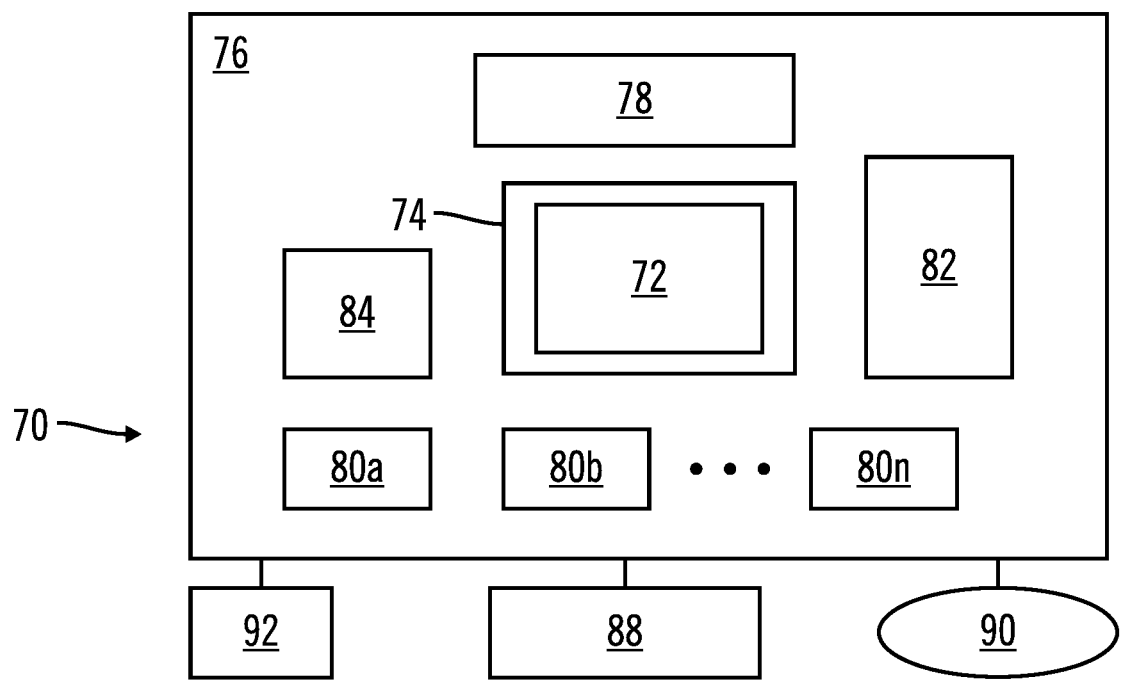
FIG. 7 illustrates an electronic system arrangement in which embodiments may find application.

Assemblies including structures formed as described in embodiments above may find application in a variety of electronic components. FIG. 7 schematically illustrates one example of an electronic system environment in which aspects of described embodiments may be embodied. Other embodiments need not include all of the features specified in FIG. 7, and may include alternative features not specified in FIG. 7. The system 70 of FIG. 7 may include at least one die such as a CPU 72 positioned in a package substrate 74, which is then coupled to a substrate such as a PCB 76 (for example, a motherboard). The system 70 includes a memory region 78 that may include any suitable memory, for example, DRAM. One or more controllers 80a, 80b ... 80n, may also be disposed on the PCB 76. The system may also include components 82, 84, which may be any suitable component including, but not limited to, sensors, and antennas. The system 70 may be formed with additional components, including, but not limited to, storage 88, display 90, and network connection 92. Any of the structures on the PCB 76 may be formed to include a substrate include backside features including a self-assembled monolayer (SAM) structuring process that forms a SAM layer on which a metallized structure such as a passive device is formed, such as described above.

The system 70 may comprise any suitable computing device, including, but not limited to, a mainframe, server, personal computer, workstation, laptop, tablet, netbook, handheld computer, handheld gaming device, handheld entertainment device (for example, MP3 (moving picture experts group layer-3 audio) player), PDA (personal digital assistant) smart phone or other telephony device (wireless or wired), network appliance, virtualization device, storage controller, network controller, router, etc.

Various features of embodiments described above may be implemented with respect to other embodiments, including apparatus and method embodiments. The order of certain operations as set forth in embodiments may also be modified. Specifics in the examples may be used anywhere in one or more embodiments.

In the present description, various features are grouped together for the purpose of streamlining the disclosure. This method of disclosure is not to be interpreted as reflecting an intention that the claimed embodiments of the invention require more features than are expressly recited in each claim. Rather, as the claims reflect, inventive subject matter may lie in less than all features of a single disclosed embodiment. Thus the claims are hereby incorporated into the Detailed Description, with each claim standing on its own as a separate embodiment.

While certain exemplary embodiments are described herein and shown in the accompanying drawings, it is to be understood that such embodiments are merely illustrative and not restrictive, and that embodiments are not restricted to the specific constructions and arrangements shown and described since modifications may occur to those having ordinary skill in the art. Terms such as "first", "second", and the like may be used herein and do not necessarily denote any particular order, quantity, or importance, but are used to distinguish one element from another. The enumerated listing of items does not imply that any or all of the items are mutually exclusive, unless expressly specified otherwise. The terms "a" and "an" mean "one or more", unless expressly specified otherwise. Terms such as "upper", "lower", "top", "bottom", and the like may be used for descriptive purposes only and are not to be construed as limiting. Embodiments may be manufactured, used, and contained in a variety of positions and orientations.

EXAMPLES

The following examples pertain to further embodiments. Specifics in the examples may be used anywhere in one or more embodiments.

Example 1 is an electronic device comprising: a substrate comprising a semiconductor, the substrate including a front side comprising active elements and a backside opposite the front side; a dielectric layer on the backside; and a passive component on the dielectric layer on the backside.

In Example 2, the subject matter of any one of Examples 1 and 3-12 can optionally include a plurality of through substrate vias (TSVs) electrically coupling the front side to the backside.

In Example 3, the subject matter of any one of Examples 1-2 and 4-12 can optionally include a plurality of openings extending through the dielectric layer, and an electrically conductive material extending through the openings and electrically coupled to the TSVs.

In Example 4, the subject matter of any one of Examples 1-3 and 5-12 can optionally include wherein substrate comprises a first die, the apparatus further comprising a second die stacked on the first die, wherein the dielectric layer is located between the first die and the second die.

In Example 5, the subject matter of any one of Examples 1-4 and 6-12 can optionally include wherein the passive component is selected from the group consisting of an inductor, a capacitor, a filter, a signal line, a stub, a bonding pad, and an antenna.

In Example 6, the subject matter of any one of Examples 1-5 and 7-12 can optionally include wherein the passive component comprises a plurality of bonding pads configured to be coupled to an additional component.

In Example 7, the subject matter of any one of Examples 1-6 and 8-12 can optionally include wherein the dielectric layer comprises a laminate dielectric layer.

In Example 8, the subject matter of any one of Examples 1-7 and 9-12 can optionally include wherein the dielectric layer comprises a polymer.

In Example 9, the subject matter of any one of Examples 1-8 and 10-12 can optionally include a self-assembled monolayer (SAM) bonded to the dielectric layer, the SAM positioned between the passive component and the dielectric layer.

In Example 10, the subject matter of any one of Examples 1-9 and 11-12 can optionally include wherein the passive component comprises a metal structure on the self-assembled monolayer (SAM) on the dielectric layer, wherein the SAM is positioned between the metal structure and the dielectric layer.

In Example 11, the subject matter of any one of Examples 1-10 and 12 can optionally include wherein the metal structure includes a first metal and a second metal, the second metal comprising palladium (Pd), wherein the second metal comprising palladium is positioned between the first metal and the SAM.

In Example 12, the subject matter of any one of Examples 1-11 can optionally include wherein the SAM comprises a first SAM, and wherein the passive component comprises a multilayer component including a first electrode, a second electrode, and a dielectric layer between the first electrode and the second electrode, wherein the first electrode is positioned on the first SAM, wherein the dielectric layer between the first electrode and the second electrode comprises an additional laminate dielectric and a second SAM positioned on the additional laminate dielectric, and wherein the second electrode is positioned on the second SAM.

Example 13 is a method for forming an electronic device, comprising: providing a substrate including a front side including active elements and a backside opposite the front side; positioning a dielectric layer on the backside of the substrate; and positioning a passive component on the dielectric layer on the backside of the substrate.

In Example 14, the subject matter of any one of Examples 13 and 15-23 can optionally include wherein the substrate is provided with a plurality of through substrate vias (TSVs) electrically coupling the front side to the backside, the method further comprising forming a plurality of openings extending through the dielectric layer, and positioning an electrically conductive material in the openings and electrically coupled to the TSVs.

In Example 15, the subject matter of any one of Examples 13-14 and 16-23 can optionally include wherein the substrate comprises a first die, further comprising positioning a second die on the first die, wherein the dielectric layer is located between the first die and the second die.

In Example 16, the subject matter of any one of Examples 13-15 and 17-23 can optionally include forming the passive component to be a structure selected from the group consisting of a capacitor, an inductor, and an antenna.

In Example 17, the subject matter of any one of Examples 13-16 and 18-23 can optionally include wherein the positioning the dielectric layer on the backside comprises positioning a plurality of dielectric layers on the backside.

In Example 18, the subject matter of any one of Examples 13-17 and 19-23 can optionally include wherein the positioning the dielectric layer on the backside comprises positioning a laminate dielectric layer on the backside.

In Example 19, the subject matter of any one of Examples 13-18 and 20-23 can optionally include bonding a self-assembled monolayer (SAM) to the dielectric layer, the SAM located between the passive component and the dielectric layer.

In Example 20, the subject matter of any one of Examples 13-19 and 21-23 can optionally include forming the passive component to comprise a metal structure on the self-assembled monolayer (SAM) on the dielectric layer, wherein the SAM is located between the metal structure and the dielectric layer.

In Example 21, the subject matter of any one of Examples 13-20 and 22-23 can optionally include forming the metal structure to include a first metal and a second metal, the second metal comprising palladium (Pd), wherein the second metal comprising palladium is located between the first metal and SAM.

In Example 22, the subject matter of any one of Examples 13-21 and 23 can optionally include wherein the providing a passive component includes forming a first electrode on the SAM, forming a dielectric layer comprising an additional SAM on the first electrode, and forming a second electrode on the additional SAM.

In Example 23, the subject matter of any one of Examples 13-22 can optionally include positioning a die to be electrically coupled to the substrate, including positioning the die so that the dielectric layer is located between the die and the substrate.

Example 24 is an electronic device comprising: a substrate comprising a semiconductor, the substrate including a front side comprising active elements and a backside opposite the front side; a plurality of through-substrate vias (TSVs) extending through the substrate and electrically coupling the front side and the backside of the substrate; a redistribution layer on the backside, the redistribution layer including electrically conductive regions coupled to the TSVs; a dielectric layer on the backside; a plurality of openings extending though the dielectric layer, the openings including an electrically conductive material therein that is electrically coupled to the redistribution layer; a self-assembled monolayer (SAM) on the dielectric layer; and a passive component comprising a metal on the SAM, wherein the SAM is positioned between the passive component and the dielectric layer.

In Example 25, the subject matter of any one of Examples 24 and 26-31 can optionally include a die electrically coupled to the substrate through the openings extending through the dielectric layer, wherein the dielectric layer is positioned between the die and the substrate.

In Example 26, the subject matter of any one of Examples 24-25 and 27-31 can optionally include wherein the passive component is selected from the group consisting of an inductor, a capacitor, a filter, a signal line, a stub, a bonding pad, and an antenna.

In Example 27, the subject matter of any one of Examples 24-26 and 28-31 can optionally include wherein the passive component comprises a plurality of bonding pads configured to be coupled to an additional component.

In Example 28, the subject matter of any one of Examples 24-27 and 29-31 can optionally include wherein the dielectric layer comprises a laminate dielectric layer.

In Example 29, the subject matter of any one of Examples 24-28 and 30-31 can optionally include wherein the dielectric layer comprises a polymer.

In Example 30, the subject matter of any one of Examples 24-29 and 31 can optionally include wherein the metal includes a first metal and a second metal, the second metal comprising palladium (Pd), wherein the second metal comprising palladium is positioned between the first metal and the SAM.

In Example 31, the subject matter of any one of Examples 24-30 can optionally include wherein the SAM comprises a first SAM, and wherein the passive component comprises a multilayer component including a first electrode, a second electrode, and a dielectric layer between the first electrode and the second electrode, wherein the first electrode is positioned on the first SAM, wherein the dielectric layer between the first electrode and the second electrode comprises an additional laminate dielectric and a second SAM positioned on the additional laminate dielectric, and wherein the second electrode is positioned on the second SAM.

Example 32 is an electronic device comprising: a substrate including a front side including active elements and a backside opposite the front side; means for positioning a dielectric layer on the backside of the substrate; and means for positioning a passive component on the dielectric layer on the backside of the substrate.

Example 33 is an apparatus comprising means to perform a method as claimed in any preceding claim.

What is claimed:
1. An apparatus comprising:
   a substrate comprising a semiconductor, the substrate including a front side comprising active elements and a backside opposite the front side;
   a dielectric layer on the backside, wherein the dielectric layer comprises a polymer layer;
   a self-assembled monolayer (SAM) bonded to the dielectric layer; and
   a passive component on the dielectric layer on the backside, wherein the passive component is positioned on the SAM on the polymer layer, wherein the SAM is positioned between the passive component and the polymer layer.

2. The apparatus of claim 1, further comprising a die electrically coupled to the substrate, wherein the dielectric layer is positioned between the die and the substrate.

3. The apparatus of claim 1, wherein the substrate comprises a first die, the apparatus further comprising a second die stacked on the first die, wherein the dielectric layer is located between the first die and the second die, and wherein the passive component is positioned between the first die and the second die.

4. The apparatus of claim 1, wherein the dielectric layer comprises a laminate dielectric layer.

5. The apparatus of claim 1, wherein the dielectric layer comprises a polymer.

6. The apparatus of claim 1, wherein the passive component comprises an inductor.

7. The apparatus of claim 1, wherein the passive component comprises a component selected from the group of a capacitor, a filter, and a stub.

8. The apparatus of claim 1, wherein the passive component comprises a plurality of bonding pads.

9. The apparatus of claim 1, wherein the passive component comprises an antenna.

10. The apparatus of claim 1, wherein the passive component comprises a signal line.

11. The apparatus of claim 2, wherein the passive component is positioned between the substrate and the die.

12. An apparatus comprising:
    a substrate comprising a semiconductor, the substrate including a front side comprising active elements and a backside opposite the front side;
    a plurality of through-substrate vias (TSVs) extending through the substrate and electrically coupling the front side and the backside of the substrate;
    a redistribution layer on the backside, the redistribution layer including electrically conductive regions coupled to the TSVs;
    a dielectric layer on the backside;
    a plurality of openings extending though the dielectric layer, the openings including an electrically conductive material therein that is electrically coupled to the redistribution layer;
    a self-assembled monolayer (SAM) positioned on the dielectric layer; and
    a passive component on the SAM, wherein the SAM is positioned between the passive component and the dielectric layer.

13. The apparatus of claim 12, further comprising a die electrically coupled to the substrate through the openings extending through the dielectric layer, wherein the dielectric layer is positioned between the die and the substrate.

14. The apparatus of claim 12, wherein the dielectric layer on the backside comprises a polymer layer.

15. The apparatus of claim 12, wherein the dielectric layer on the backside comprises a laminate dielectric layer.

16. The apparatus of claim 12, wherein the passive component comprises an inductor.

17. The apparatus of claim 12, wherein the passive component comprises a component selected from the group of a capacitor, filter, and a stub.

18. The apparatus of claim 12, wherein the passive component comprises a plurality of bonding pads configured to be coupled to an additional component.

19. The apparatus of claim 13, wherein the passive component is positioned between the substrate and the die.

20. The apparatus of claim 13, wherein the substrate comprises a first die, wherein the die electrically coupled to the substrate comprises a second die, and wherein the passive component is positioned between the first die and the second die.

* * * * *